United States Patent
Raghavan et al.

(10) Patent No.: US 9,203,122 B2
(45) Date of Patent: Dec. 1, 2015

(54) MONITORING AND MANAGEMENT FOR ENERGY STORAGE DEVICES

(71) Applicant: Palo Alto Research Center Incorporated, Palo Alto, CA (US)

(72) Inventors: Ajay Raghavan, Mountain View, CA (US); Peter Kiesel, Palo Alto, CA (US); Bhaskar Saha, Union City, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 337 days.

(21) Appl. No.: 13/630,660

(22) Filed: Sep. 28, 2012

(65) Prior Publication Data

US 2014/0092375 A1   Apr. 3, 2014

(51) Int. Cl.
| | | |
|---|---|---|
| G01B 11/16 | (2006.01) |
| H01M 10/48 | (2006.01) |
| G01L 1/24 | (2006.01) |
| G01R 31/36 | (2006.01) |

(52) U.S. Cl.
CPC .............. *H01M 10/48* (2013.01); *G01L 1/246* (2013.01); *G01R 31/3606* (2013.01); *G01R 31/3679* (2013.01); *H01M 10/486* (2013.01)

(58) Field of Classification Search
CPC ...... G01B 11/16; G01B 11/18; G01B 11/165; G01L 1/24; G01M 11/086; G01N 21/55; G01N 21/57; G01N 21/553; G01N 21/554; G01N 21/474
USPC .................................................. 356/445, 32
See application file for complete search history.

(56) References Cited

U.S. PATENT DOCUMENTS

| | | |
|---|---|---|
| 5,949,219 A | 9/1999 | Weiss |
| 5,995,686 A | 11/1999 | Hamburger et al. |
| 7,155,075 B2 | 12/2006 | Rajendran et al. |
| 7,310,153 B2 | 12/2007 | Kiesel et al. |
| 7,315,667 B2 | 1/2008 | Kiesel et al. |
| 7,433,552 B2 | 10/2008 | Kiesel |

(Continued)

FOREIGN PATENT DOCUMENTS

| | | |
|---|---|---|
| EP | 2492989 | 10/2013 |
| WO | WO2014026093 | 2/2014 |

OTHER PUBLICATIONS

Klein et al., "Optimal Charging Strategies in Lithium-Ion Battery", 2011 American Control Conference, Jun. 29-Jul. 1, 2011, pp. 382-387.

(Continued)

*Primary Examiner* — Abdullahi Nur
(74) *Attorney, Agent, or Firm* — Hollingsworth Davis, LLC

(57) ABSTRACT

A monitoring and management system (MMS) includes one or more fiber optic cables arranged within or on portions of an energy storage device. Each fiber optic cable includes multiple optical sensors. At least one of the optical sensors is configured to sense a parameter of the energy storage device that is different from a parameter of the energy storage device sensed by at least another optical sensor of the multiple optical sensors. The MMS includes a light source configured to provide light to the one or more fiber optic cables and a detector configured to detect light reflected by the optical sensors. The detector generates an electrical signal based on the reflected light. A processor is coupled to receive the electrical signal, to analyze the electrical signal, and to determine state of the energy storage device based on analysis of the electrical signal.

20 Claims, 12 Drawing Sheets

(56) References Cited

U.S. PATENT DOCUMENTS

| | | | |
|---|---|---|---|
| 7,511,823 B2 | 3/2009 | Schultz et al. | |
| 7,522,786 B2 | 4/2009 | Kiesel et al. | |
| 7,589,312 B2 | 9/2009 | Kojima | |
| 7,701,590 B2 | 4/2010 | Kiesel et al. | |
| 7,718,948 B2 | 5/2010 | Kiesel | |
| 7,766,544 B2 | 8/2010 | Shibuya et al. | |
| 8,437,582 B2 | 5/2013 | Kiesel | |
| 8,594,470 B2 | 11/2013 | Kiesel et al. | |
| 2006/0045412 A1* | 3/2006 | Xiao et al. | 385/14 |
| 2009/0027009 A1 | 1/2009 | Sivertsen | |
| 2009/0220189 A1 | 9/2009 | Kiesel | |
| 2009/0274849 A1 | 11/2009 | Scott et al. | |
| 2010/0032009 A1 | 2/2010 | Skryabin | |
| 2010/0247027 A1* | 9/2010 | Xia et al. | 385/12 |
| 2013/0312947 A1 | 11/2013 | Bandhauer et al. | |
| 2013/0314094 A1 | 11/2013 | Farmer et al. | |
| 2014/0092375 A1 | 4/2014 | Raghavan et al. | |
| 2014/0203783 A1* | 7/2014 | Kiesel et al. | 320/134 |

OTHER PUBLICATIONS

Kumai et al., "Gas Generation Mechanism Due to Electrolyte Decomposition in Commercial Lithium-Ion Cell", Journal of Power Sources 81-82, 1999, pp. 715-719.
Pinson et al., Theory of SEI Formation in Rechargeable Batteries: Capacity Fade, Accelerated Aging and Lifetime Prediction, $223^{rd}$ ECS Meeting, May 12-17, 2013, 29 pages.
Roth et al., "Thermal Abuse Performance of 18650 Li-Ion Cells", Sandia Report, Mar. 2004, pp. 1-139.
Smith et al., "Power and Thermal Characterization of a Lithium-Ion Battery Pack for Hybird-Electric Vehicles", Journal of Power Sources 160, 2006, pp. 662-673.
Wang et al., "Aging Effects to Solid Electrolyte Interface (SEI) Membrane Formation and the Performance Analysis of Lithium Ion Batteries", Int. J. Electrochem, Sci., 6, 2011, pp. 1014-1026.
Cao-Paz et al., "A Multi-Point Sensor Based on Optical Fiber for the Measurement of Electrolyte Density in Lead-Acid Batteries", Sensors 2010, 10, pp. 2587-2608.
Corbellini et al., "Modified POF Sensor for Gaseous Hydrogen Fluoride Monitoring in the Presence of Ionizing Radiations", IEEE Transactions on Instrumentation and Measurement, vol. 61, No. 5, May 2012, pp. 1201-1208.
Grobnic et al., "Sapphire Fiber Bragg Grating Sensor Made Using Femtosecond Laser Radiation for Ultrahigh Temperature Applications", IEEE Photonics Technology Letters, vol. 16, No. 11, Nov. 2004, p. 2505-2507.
Haase, "Strain Sensors Based on Bragg Gratings", IMEKO $20^{th}$ TC3, $3^{rd}$ TC16 and $1^{st}$ TC22 International Conference Cultivating Metrological Knowledge, Nov. 27, 2007, 8 pages.
Jansen et al., "Low-Cost Flexible Packaging for High-Power Li-Ion HEV Batteries", FreedomCar & Vehicle Technologies Office, Jun. 2004, 56 pages.
Juergens et al., "Performance Evaluation of Fiber Bragg Gratings at Elevated Temperatures", NASA, Jan. 2004, 14 pages.
Kersey et al., "Fiber Grating Sensors", Journal of Lightwave Technology, vol. 15, No. 8, Aug. 1997, pp. 1442-1463.
Lee et al., "In Situ Monitoring of Temperature Inside Lithium-Ion Batteries by Flexible Micro Temperature Sensors", Sensors 2011, 11, pp. 9942-9950.
Liang et al., "Highly Sensitive Fiber Bragg Grating Refractive Index Sensors", Applied Physics Letters, vol. 86, 2005, pp. 151122-1-151122-3.
Merzbacher et al., "Fiber Optic Sensors in Concrete Structures: A Review", Smart Mater. Struct., 5, 1996, pp. 196-280.
Micron Optics, "Optical Fiber Sensors Guide", 21 pages.
Qi et al., "In Situ Observation of Strains During Lithiation of a Graphite Electrode", Journal of the Electrochemical Society, vol. 157 (6), 2010, pp. A741-A747.
Qin et al., "Specific Fluorescence Determination of Lithium Ion Based on 2-(2-hydroxyphenyl)benzoxazole", The Royal Society of Chemistry, 2001, pp. 1499-1501.
Rodrigues et al., "A Review of State-of-Charge Indication of Batteries by Means of A.C. Impedance Measurements", Journal of Power Sources, vol. 87, 2000, pp. 12-20.
Sang et al., "Temperature-Insensitive Chemical Sensor Based on a Fiber Bragg Grating", Sensors and Actuators B 120, 2007, pp. 754-757.
Siegel et al., "Neutron Imaging of Lithium Concentration in FLP Pouch Cell Battery", Journal of the Electrochemical Society, 158 (6), 2011, 8 pages.
Tang et al., "Measurement of Chloride-Ion Concentration with Long-Period Grating Technology", Smart Mater Struct. vol. 16, 2007, pp. 665-672.
Udd et al., "Fiber Optic Distributed Sensing Systems for harsh Aerospace Enviroments", 12 pages.
Van Steenkiste et al., "Strain and Temperature Measurement with Fiber Optic Sensors", 1997, 9 pages.
Koch et al., "Arrayed waveguide grating interrogator for fiber Bragg grating sensors: measurement and simulation", Applied Optics, vol. 51, No. 31, Nov. 1, 2012, pp. 7718-7723.
Niewczas et al. "Performance Analysis of the Fiber Bragg Grating Interrogation System Based on an Arrayed Waveguide Grating", IEEE Transactions on Instrumentation and Measurement, vol. 53, No. 4, Aug. 2004, pp. 1192-1195.
Li et al., "Preliminary Investigation of an SOI-based Arrayed Waveguide Grating Demodulation Integration Microsystem"Scientific Reports, May 6, 2014, 6 pages.
U.S. Appl. No. 14/257,673, filed Apr. 21, 2014, Raghavan et al.
U.S. Appl. No. 14/331,318, filed Jul. 15, 2014, Hegyi et al.
Chehura et al. "Temperature and strain discrimination using a single tilted fibre Bragg grating", Opt. Commun., vol. 275, No. 2, Jul. 2007, pp. 344-347.
Guan et al. "Simultaneous strain and temperature measurement using a single fibre Bragg grating", Electron. Lett.,vol. 36, No. 12, 2000, pp. 1018-1019.
Jin et al. "Geometric representation of errors in measurements of strain and temperature", Opt. Eng., vol. 36, No. 8, 1997, pp. 2272-2278.
Jin et al. "Simultaneous measurement of strain and temperature: error analysis". Opt. Eng.•vol. 36, No. 2, 1997. pp. 598-609.
Patrick et al. "Hybrid fiber Bragg grating/long period giber grating sensor for strain/temperature discrimination", IEEE Photonics Technol. Lett., vol. 8, No. 9, 1996, pp. 1223-1225.
Rao: "In-fibre Bragg grating sensors", Meas. Sci. Technol., vol. 8, No. 4, Apr. 1997, pp. 355-375.
Reimers et al. "Electrochemical and In Situ X-Ray Diffraction Studies of Lithium Intercalation in Li x CoO2", Journal of the Electrochemical Society, 139 (8), 1992.
Saha et al. "Battery Data Set", NASA Ames Prognostics Data Repository, 2007, Available online: http://tLarc.nasa.gov/tech/dash/pcoe/prognostic-data-repository/.
Sethuraman et al. "Surface structural disordering in graphite upon lithium intercalation/deintercalation", Journal of Power Sources 195 (2010) 3655-3660.
Triollet et al. "Discriminated measure of strain and temperature in metallic specimen with embedded superimposed long and short fibre Bragg gratings", Meas. Sci. Technol., vol. 22, No. 1, Jan. 2011, pp. 015202.
Wang et al. "Simultaneous measurement of strain and temperature using dual-period fiber grating", Proc. SP!E, vol. 4579, 2001, pp. 265-268.
Wang et al. "Understanding Volume Change in Lithium-Ion Cells during Charging and Discharging Using In Situ Measurements", Journal of The Electrochemical Society, 154 (1), 2007.
Xu et al. "Discrimination between strain and temperature effects using dual-wavelength fibre grating sensors", Electron. Lett., vol. 30, No. 13, pp. 1085-1087, 1994.
Zhao et al. "Discrimination methods and demodulation techniques for fiber Bragg grating sensors", Opt. Lasers Eng., vol. 41, No. 1, pp. 1-18, Jan. 2004.
Zhou et al. "Simultaneous measurement for strain and temperature using fiber Bragg gratings and multimode fibers", Appl. Opt., vol. 47, No. 10, Apr. 2008, pp. 1668-1672.
File History for U.S. Appl. No. 14/242,853, 153 pages.

\* cited by examiner

MONITORING AND MANAGEMENT FOR ENERGY STORAGE DEVICES

TECHNICAL FIELD

This application relates generally to techniques for monitoring and/or managing energy storage and/or power systems. The application also relates to components, devices, systems, and methods pertaining to such techniques.

SUMMARY

Various embodiments described herein involve systems and methods for monitoring and/or managing energy storage devices, power systems and other such devices. In some embodiments, a monitoring and management system (MMS) includes one or more fiber optic cables arranged within or on portions of an energy storage device. Each fiber optic cable includes multiple optical sensors. At least one of the optical sensors is configured to sense a parameter of the energy storage device that is different from a parameter of the energy storage device sensed by at least another optical sensor of the multiple optical sensors. The MMS includes a light source configured to provide light to the one or more fiber optic cables and a detector configured to detect light reflected by the optical sensors. The detector generates an electrical signal based on the reflected light. A processor is coupled to receive the electrical signal, to analyze the electrical signal, and to determine state of the energy storage device based on analysis of the electrical signal. In some implementations, the multiple fiber optic cables comprise multi-mode fiber optic cables.

Some embodiments involve a method for monitoring and/or managing an energy storage device or power system. Light is transmitted into one or more fiber optic cables, the fiber optic cables arranged within or on components of the energy storage device. Each fiber optic cable includes multiple optical sensors, at least one of the optical sensors configured to sense an internal parameter of the energy storage device that is different from a parameter sensed by at least one other optical sensor of the multiple optical sensors. Light reflected by one or more of the multiple optical sensors is detected by a detector that generates an electrical signal in response to detecting the reflected light. The electrical signal is analyzed and to determine the state of the energy storage device.

BRIEF DESCRIPTION OF THE DRAWINGS

Like reference numbers refer to like components; and

Drawings are not necessarily to scale unless otherwise indicated.

DESCRIPTION

Battery management systems that rely on external cell performance parameters to determine state-of-charge (SOC) and/or state-of-health (SOH) result in conservative overdesign to manage the uncertainty in battery state-of-charge and battery degradation with aging. This reliance on conservative overdesign of batteries has affected the widespread adoption of clean technologies such as electric vehicles and power grid storage. Conservative overdesign of batteries arises in part because the battery state cannot be fully understood from external parameters alone. This situation also applies to other types of energy storage devices and/or power generation systems where it is difficult to measure internal parameters.

Embodiments described in this disclosure involve optically-based smart monitoring and management systems which can be used for power generation systems and/or energy storage devices. The monitoring and management systems disclosed herein enable comprehensive real-time performance management and reduce overdesign of power and/or energy systems. The monitoring and management systems disclosed herein combine embedded fiber optic sensors to detect internal energy storage/power system parameters and may also include external sensors to detect external energy storage/power system parameters. The outputs from the internal and/or external sensors are used by smart algorithms to infer energy storage/power system state information, and to make predictions such as state-of-health and remaining useable energy of the energy storage system. The approaches disclosed herein are applicable to batteries and battery packs, fuel cell stacks, turbine-based power systems, and other types of energy storage and power generation devices and systems.

Figure 1:
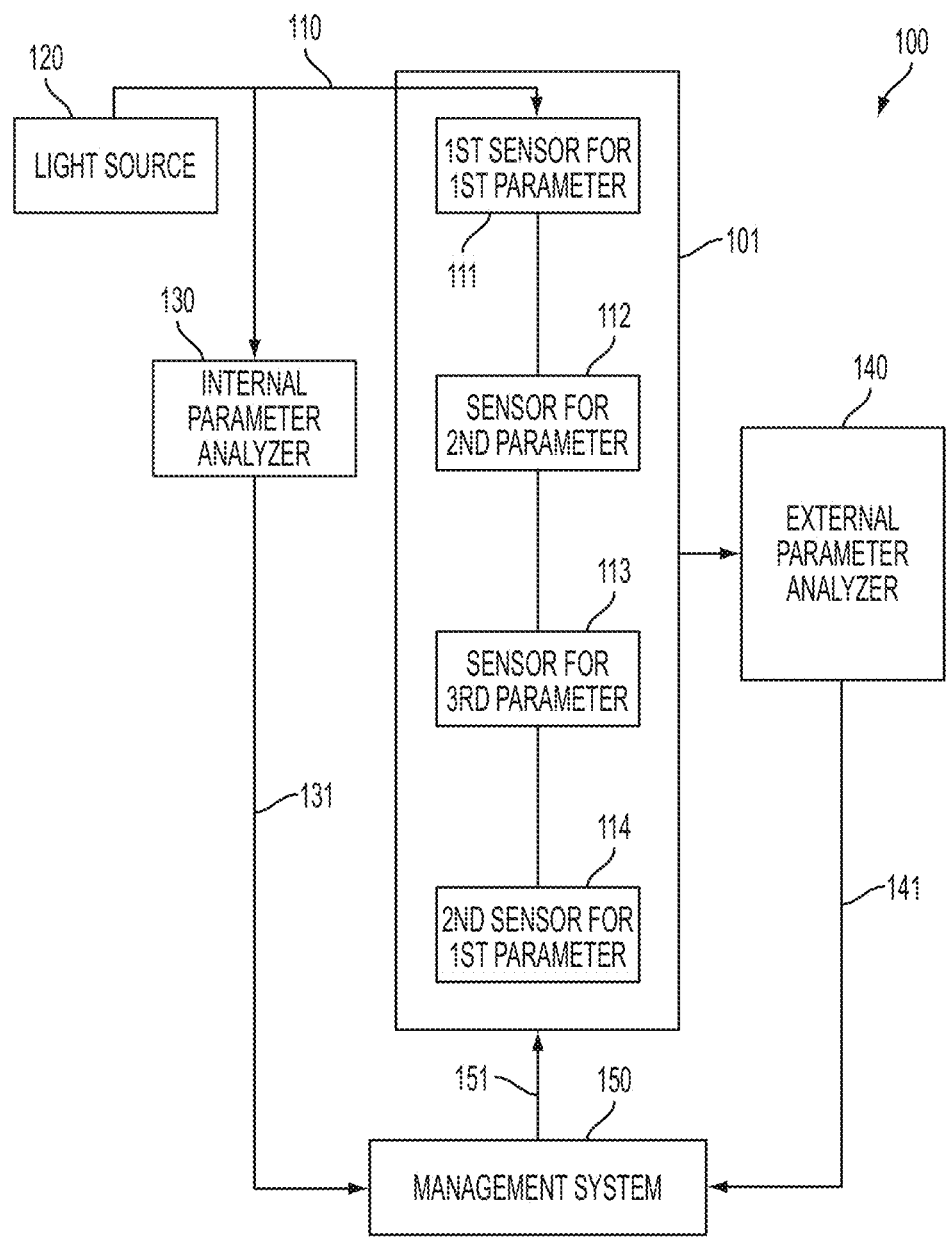
FIG. 1 shows a general block diagram of a monitoring and management system according to embodiments described herein.

FIG. 1 is a block diagram of a monitoring and management system (MMS) 100 that can be used for energy storage devices and/or power generation systems. Multiple internal optical sensors 111-114 are arranged within the interior of an energy storage/power system 101 and can be configured to sense multiple internal properties of the energy storage/power system 101. For example, the internal optical sensors 111-114 may measure one or more parameters such as internal temperature, stress, strain, acceleration, ion concentration, chemistry, and/or other internal parameters of the energy storage/power system 101. The internal optical sensors 111-114 shown in FIG. 1 sense first, second, and third parameters. The first, second and third parameters are different types of parameters such as temperature, strain, and/or chemistry. In the illustrated example, sensor 111 is a first sensor sensing a first parameter and sensor 114 is a second sensor also sensing the first parameter. Sensor 111 and sensor 114 may be located at different locations within the energy storage/power system 101 and/or the outputs of sensor 111 and sensor 114 may be combined to yield an average or composite value for the first sensed parameter. Alternatively, multiple sensors of the same type can be used to develop a map of the spatial distribution of one or more parameters at the interior and/or exterior of the energy storage device or power generation system. Note that although terms first, second, and third are used in this example, these terms are not intended to imply any hierarchy or priority and are only used to distinguish between different sensors and/or parameters.

The internal optical sensors 111-114 are coupled through one or more fiber optic (FO) cables 110 to a light source 120 and internal parameter analyzer 130. In some cases, the optical sensors 111-114 are disposed on a single FO cable and the optical signals from the sensors are multiplexed using techniques such as optical time division multiplexing (TDM) and/or optical wavelength division multiplexing (WDM) and/or other varieties of optical signal multiplexing. The sensors disposed on the FO may comprise any type (or multiple types) of optical sensor, including fiber Bragg grating (FBG) sensors and/or etalon or Fabry-Perot (FP) sensors. Both the FBG, etalon, and FP sensors are collectively referred to herein as FO sensors. Although some examples are provided below are based on FBG sensors, it will be understood that other types of optical sensors could alternatively or additionally be used in these and other examples.

Light source 120 provides light through fiber optic cable 110 to the internal optical sensors 111-114 where the transmitted light interacts with each sensor 111-114. Each sensor transmits certain wavelengths of light and reflects certain wavelengths of light. In some cases, some sensors interact differently with the light than other sensors. For example, the wavelengths reflected by some sensors may be different from the wavelengths reflected by other sensors. Light reflected by the sensors 111-114 is detected by analyzer 130. As described in more detail below, analyzer 130 is capable of detecting shifts in the wavelengths of light reflected from the sensors 111-114, where the wavelength shifts in the reflected light are indicative of the sensed internal parameters.

The MMS 100 may optionally include an external parameter analyzer 140 arranged externally to the energy storage/power system 101 configured to measure one or more external parameters, such as current, voltage, and/or power output of the energy storage/power system 101. In some implementations, the internal parameter analyzer 130 and/or the external parameter analyzer 140 can be electrically coupled to a management system 150 through output lines 131 and 141, respectively. The internal parameter analyzer 130 provides information about the internal parameters on output line 131 and the external parameter analyzer provides information about the external parameters on output line 141. The management system 150 typically includes a processor and/or other electrical circuitry configured implement various processes that assess energy storage/power system status based on the information provided by the internal parameter analyzer 130 and/or the external parameter analyzer 140. According to various implementations, some aspects of the energy storage/power system 101, e.g., charge rate and/or charge cycles in the case of a battery, may be automatically controlled through a feedback output 151 from the management system 150. The management system may use information from the internal parameter analyzer and/or the external parameter analyzer to make predictions and/or estimations regarding the state of the energy storage/power system. These predictions and estimations may be developed using theoretical and/or empirical data and may be adaptable based on operational conditions of the energy storage/power system, measures of internal and/or external parameters and/or correlations between the operational conditions and measured parameters. Some implementations may provide energy storage/power system monitoring and thus may not include the management system, and/or in some implementations the management system may not provide feedback to the energy storage/power system.

In some cases, information based on the internal and/or external parameter analyzers can be developed by the management system 150 and provided to an operator via an electronic or printed report. For example, the management system 150 may compile, analyze, trend, and/or summarize the internal and/or external parameters, and/or may perform other processes based on the internal and/or external parameters, such as predicting and/or estimating the state of the energy storage/power system. The results of these processes and/or other information derived from monitoring the energy storage/power system may be provided in a report that can be displayed graphically or textually or in any convenient form to an energy storage/power system operator and/or may be provided to another computer system for storage in a database and/or further analysis. As previously discussed, the monitoring and management systems described herein is generally applicable to a variety of energy storage/power systems or energy storage/power system components, including turbine-based power systems, batteries, fuel cell stacks, and/or other types of systems.

Figure 2:
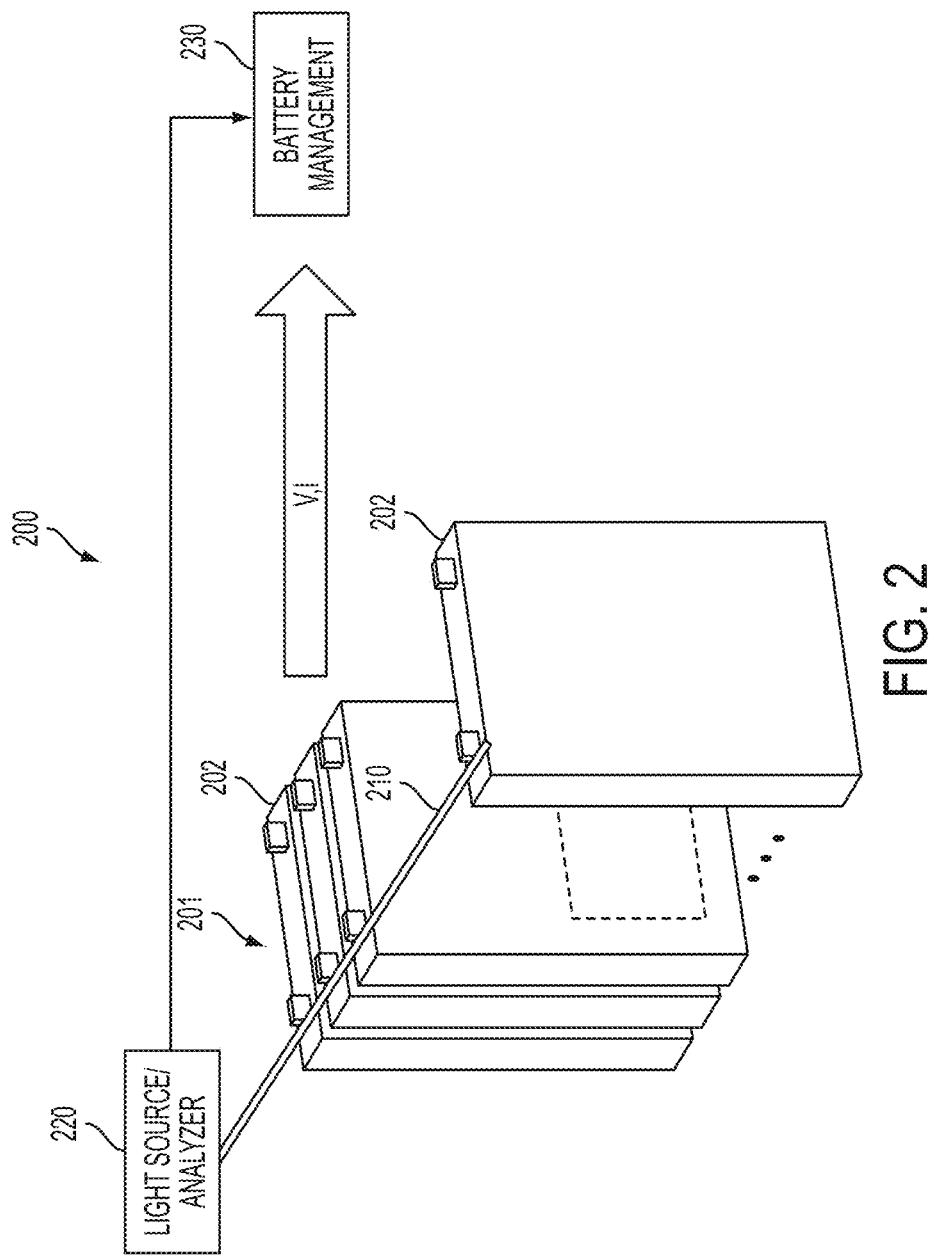
FIG. 2 shows a block diagram of a monitoring and management system for a battery.

For example, the MMS 100 shown in FIG. 1 can be used to monitor and/or manage the state-of-charge and/or state-of-health of a battery that powers an electric vehicle. FIG. 2 illustrates a battery 201 that is monitored and/or managed by a battery monitoring and management system (BMMS) 200. The monitoring portion of the BMMS comprises a number of multiplexed FBG sensors (not shown) embedded within the cells 202 of the battery 201 and disposed on a single optical fiber (FO) cable 210. The BMMS system may include one or more FO cables, where each FO cable includes multiple sensors. In various implementations, the internal parameters of the battery as a whole, e.g., average parameters across multiple cells, and/or internal parameters of one or more of the battery cells can be monitored. A non-limiting illustrative set of parameters that may be monitored by the sensors includes one or more of temperature, stress, strain, internal pressure, ion concentration, and/or chemical composition or concentration.

The BMMS 200 includes a light source/analyzer 220 coupled to the FO cable 210. Although one light source/analyzer 220 is shown in FIG. 2, in some configurations multiple light source/analyzers may be respectively coupled to multiple FO cables that include multiplexed optical sensors.

Light from the light source 220 is transmitted through the FO cable 210 where the transmitted light interacts with the FBG sensors that are spaced apart along the FO cable 210. Reflected light is detected and analyzed by the analyzer portion of the light source/analyzer 220. In some implementations, the voltage and/or current of the battery 201 and/or other external battery parameters may be measured and provided to the battery management processor 230.

The FBG sensors are formed by a periodic modulation of the refractive index along a finite length (typically a few mm) of the core of the FO cable. This pattern reflects a wavelength, called the Bragg wavelength that is determined by the periodicity of the refractive index profile of the FBG sensor. In practice, the sensor typically reflects a narrow band of wavelengths centered at the Bragg wavelength. The Bragg wavelength at a characteristic or base value of the external stimulus is denoted $\lambda$ and light having wavelength X (and a narrow band of wavelengths near $\lambda$) are reflected when the sensor in in the base condition. For example, the base condition may correspond to 25 degrees C. and/or zero strain. When the sensor is subjected to an external stimulus, such as temperature, strain, or other such stimulus, the stimulus changes the periodicity of the grating and the index of refraction of the FBG, and thereby alters the reflected wavelength to a wavelength, $\lambda_s$, different from the base wavelength, X. The resulting wavelength shift, $\Delta\lambda/\lambda=(\lambda-\lambda_s)/\lambda$ is a direct measure of the stimulus.

The relation between wavelength shift ($\Delta\lambda/\lambda$) and simultaneous strain and temperature in an FBG sensor is:

$$\Delta\lambda/\lambda=\{1-n^2/2\ [p_{12}-n(p_{11}+p_{12})]\}\in_1 + [\alpha+1/n\ (dn/dT)]\Delta T \quad [1]$$

where n is the index of refraction, $p_{11}$ and $p_{12}$ are strain-optic constants, $\in_1$ is longitudinal strain, $\alpha$ is the coefficient of thermal expansion and T is the temperature. In some implementations, by using multiple FBG sensors that are differently affected by strain and temperature (due to design or mounting), dual fibers or special FBG sensors in combination with data evaluation algorithms, the impacts from strain and temperature on the wavelength shift can be separated.

Examining the response of FBG sensors quantified in Equation [1], it is clear that these sensors are sensitive to changes in refractive index n, strain $\in_1$, and ambient temperature changes $\Delta T$. The refractive index n can be made sensitive to the chemical environment of the sensor by stripping the FO cladding over the sensor element region and/or by adding appropriate coatings to this sensitive area. Alternately, FBG sensors can be made sensitive to the chemical environment by applying special coatings that convert the chemical composition of the environment into a strain signal (e.g. hydrogen sensors based on palladium coatings). According to embodiments discussed herein, optical sensors such as FBG sensors are used to detect chemical composition changes in battery cells that might affect performance. An example of this is formation of a corrosive agent, hydrogen fluoride (HF), in Li-ion cells caused by moisture penetration.

The sensitivity of FBGs to temperature changes allows local temperatures within battery cells to be monitored. While this is useful in general for battery system management, it is particularly beneficial for early detection of thermal runaways. Thermal runaways affect many battery chemistries and can be devastating in Li-ion cells due to their high energy density. During a thermal runaway, the high heat of the failing cell can propagate to the next cell, causing it to become thermally unstable as well. In some cases, a chain reaction occurs in which each cell disintegrates at its own timetable. A pack of battery cells can be destroyed within a few seconds or can linger on for several hours as each cell is consumed one-by-one.

The sensitivity of the FBG sensors to strain allows embedding FBG sensors into battery electrodes to monitor the expansion/contraction cycles of the electrodes (which is useful for estimating charge levels, e.g. in Lithium-ion cells). Additionally, electrode strain measurements allow for examining the degradation of the electrodes, and thus the overall degradation of the battery. FBG sensitivity to strain also allows measurement of internal cell pressure by capturing cell wall strains.

In measuring power supply parameters using FBG sensors, it can be beneficial to distinguish between and quantify the individual contributions of the multiple parameters of interest. In some cases, a multi-sensor configuration may be used so that the parameter of interest can be compensated for the contributions of other parameters. For example, a two-sensor approach may be used for temperature-compensated chemical sensing, where the two sensors can be arranged in close proximity. In some implementations, a first sensor of the two sensors is exposed to temperature and is also exposed to the chemical environment by stripping its cladding. A second sensor of the two sensors used for compensation retains its cladding and is only sensitive to temperature. Similar configurations may be used for temperature-compensated strain measurements and strain-compensated temperature measurements.

For temperature-compensated strain measurements, two FBG sensors are placed in close proximity where the first sensor is exposed to strain and temperature and a second sensor used for compensation is exposed to temperature but not strain. The temperature measurement of the second sensor is used to compensate for changes in temperature in the strain measurement of the first sensor. For example, the first sensor may be placed within an electrode or cell wall of a battery and the second sensor may be placed nearby and/or at a location having about equal temperature as the location of the first sensor while being subjected to a known and/or non-varying strain. For example, the second sensor may be located near but not within the electrode or cell wall.

Fiber optic sensors have been demonstrated to withstand and perform in various harsh environments. The most common material used is silica, which is corrosion resistant, can withstand high tensile strain, and can survive between −200° C. and 800° C. Silica-based FBG sensors provide repeatable dependency of their peak wavelength with temperature consistently with no thermal hysteresis in tests done up to 300° C. It is expected that FBG sensors will survive long-term (13-25 years) in lead acid batteries and at least up to a year in HF (a side product of Li-ion batteries: one year is expected to be longer than the life of the Li-ion battery after HF formation begins). Various types of plastics are also useful for FO cables and optical sensors. Fiber optic sensors such as FBG sensors and etalon (FP) sensors are robust with respect to shock and vibration. Thus, embedded fiber optic sensors in energy storage/power systems such as batteries offer an attractive solution to reliably measure and monitor relevant parameters across various architectures and chemistries.

Figure 3:
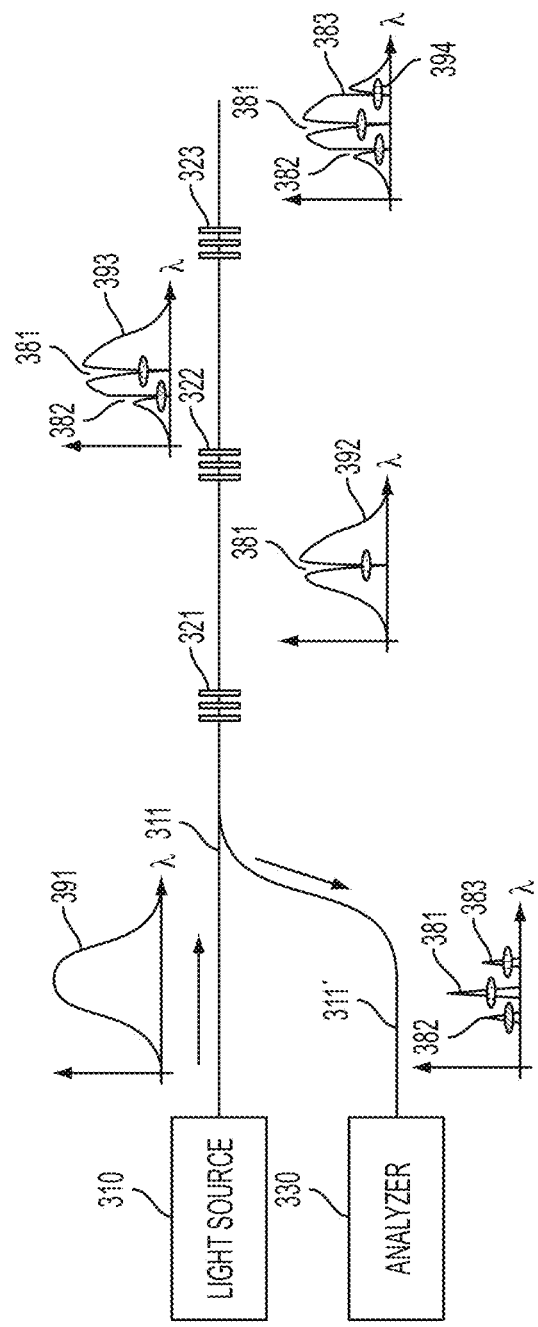
FIG. 3 illustrates reflected spectra for fiber Bragg grating (FBG) sensors used in a power supply sensing and management system.

FBG-based sensing allows for incorporating multiple sensing elements, e.g., about 64 sensors, on a single FO cable. Each of the sensors can be individually interrogated through multiplexing, e.g., WDM or TDM. One special implementation of wavelength division multiplexing for multiple sensors is illustrated in FIG. 3. A broadband light source 310 is used along with multiple FBG sensors 321-323. Each of the FBG sensors 321-323 are tuned to be primarily reflective to light at different wavelength bands and are deployed on the same optical fiber spaced apart from each other along the FO cable and at different distances from the light source 310. Each FBG sensor is designated to measure a different parameter or combination of parameters. The wavelength shifts caused by changes in the sensed parameters are small compared to the spacing between the characteristic base wavelengths of the individual FBGs. Therefore, it is feasible to separate the information from the different FBGs using linear variable filters or dispersive elements in an optical WDM scheme. Alternately, an optical TDM scheme can be implemented that operates by transmitting a train of short pulses of light in the FO cable, where the wavelengths of the light pulses differ from one another and selectively address the various FBG sensors along the FO cable.

FIG. 3 illustrates a monitoring system that monitors multiple parameters of an energy storage/power system with sensor outputs multiplexed using optical WDM. As indicted in FIG. 3, broadband light is transmitted by the light source 310, which may comprise or be a light emitting diode (LED) or superluminescent laser diode (SLD), for example. The spectral characteristic (intensity vs. wavelength) of the broadband light is shown by inset graph 391. The light is transmitted via the FO cable 311 to the first FBG sensor 321. The first FBG sensor 321 reflects a portion of the light in a first wavelength band having a central or peak wavelength, $\lambda_1$. Light having wavelengths other than the first wavelength band is transmitted through the first FBG sensor 321 to the second FBG sensor 322. The spectral characteristic of the light transmitted to the second FBG sensor 322 is shown in inset graph 392 and exhibits a notch at the first wavelength band centered at $\lambda_1$ indicating that light in this wavelength band is reflected by the first sensor 321.

The second FBG sensor 322 reflects a portion of the light in a second wavelength band having a central or peak wavelength, $\lambda_2$. Light that is not reflected by the second FBG sensor 322 is transmitted through the second FBG sensor 322 to the third FBG sensor 323. The spectral characteristic of the light transmitted to the third FBG sensor 323 is shown in inset graph 393 and includes notches centered at $\lambda_1$ and $\lambda_2$.

The third FBG sensor 323 reflects a portion of the light in a third wavelength band having a central or peak wavelength, $\lambda_3$. Light that is not reflected by the third FBG sensor 323 is transmitted through the third FBG sensor 323. The spectral characteristic of the light transmitted through the third FBG sensor 323 is shown in inset graph 394 and includes notches centered at $\lambda_1$, $\lambda_2$, and $\lambda_3$.

Light in wavelength bands 381, 382, 383, having central wavelengths $\lambda_1$, $\lambda_2$ and $\lambda_3$ (illustrated in inset graph 395) is reflected by the first, second, or third FBG sensors 321, 322, 323, respectively, along the FO cables 311 and 311' to the analyzer 330. The analyzer 330 may compare the shifts in each the central wavelengths $\lambda_1$, $\lambda_2$ and $\lambda_3$ and/or wavelength bands reflected by the sensors 321-323 to a characteristic base wavelength (a known wavelength) to determine whether changes in the parameters sensed by the sensors 321-323 have occurred. The analyzer may determine that the one or more of the sensed parameters have changed based on the wavelength analysis and may calculate a relative or absolute measurement of the change.

In some cases, instead of emitting broadband light, the light source may scan through a wavelength range, emitting light in narrow wavelength bands to which the various sensors disposed on the FO cable are sensitive. The reflected light is sensed during a number of sensing periods that are timed relative to the emission of the narrowband light. For example, consider the scenario where sensors 1, 2, and 3 are disposed on a FO cable. Sensor 1 is sensitive to a wavelength band (WB1), sensor 2 is sensitive to wavelength band WB2, and sensor 3 is sensitive to WB3. The light source may be controlled to emit light having WB1 during time period 1 and sense reflected light during time period 1a that overlaps time period 1. Following time period 1a, the light source may emit light having WB2 during time period 2 and sense reflected light during time period 2a that overlaps time period 2. Following time period 2a, the light source may emit light having WB3 during time period 3 and sense reflected light during time period 3a that overlaps time period 3. Using this version of TDM, each of the sensors may be interrogated during discrete time periods.

The FO cable used for energy storage/power system monitoring may comprise a single mode (SM) FO cable (as depicted in FIG. 3) or may comprise a multi-mode (MM) FO cable. While single mode fiber optic cables offer signals that are easier to interpret, to achieve broader applicability and lower costs of fabrication, multi-mode fibers may be used.

MM fibers may be made of plastic rather than silica, which is typically used for SM fibers. Plastic fibers may have smaller turn radii when compared with the turn radii of silica fibers, thereby making plastic fibers more practical to embed into battery cells and in individual cells of fuel cell stacks, for example. Furthermore, MM fibers can work with less expensive light sources (e.g., LEDs) as opposed to SM fibers that may need more precise alignment with superluminescent diodes (SLDs). Therefore, sensing systems based on optical sensors in MM fibers are expected to yield lower cost systems.

Figure 4:
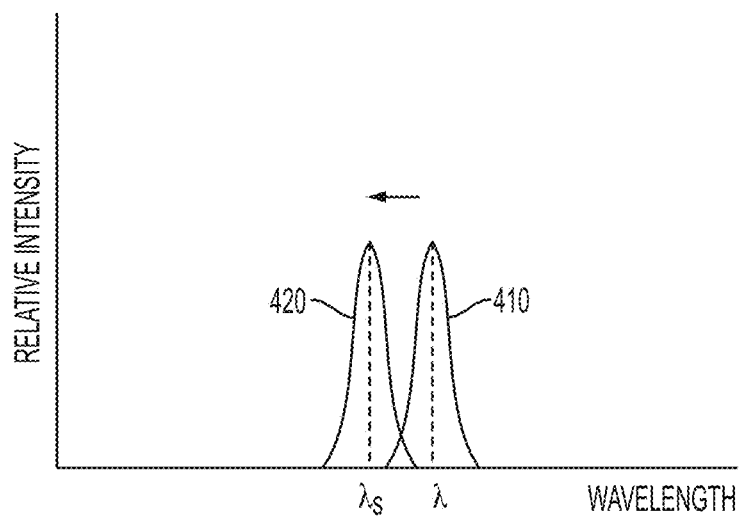
FIG. 4 shows an idealized shift in the wavelength spectrum for a FBG sensor deployed on a single mode fiber cable.

FIG. 4 is an idealized representation of light reflected from a FBG sensor deployed on a SM FO cable. In the characteristic base or known state, the FBG sensor reflects light in a relatively narrow wavelength band 410 having a central or peak wavelength, $\lambda$. After the FBG sensor experiences a change in the sensed condition, e.g., a change in temperature, strain, chemical environment, the light reflected by the sensor shifts to a different wavelength band 420 having a central wavelength $\lambda_s$. Wavelength band 420 is similar in width, amplitude and other morphological characteristics when compared to wavelength band 410, but the central wavelength, $\lambda_s$, of wavelength band 420 is shifted 430 from the central wavelength, $\lambda$, of wavelength band 410 by an amount that is related to the change in the sensed condition. Wavelength bands of similar widths can be identified as wavelength bands having similar full width half maximum (FWHM) values, for example.

Figure 5:
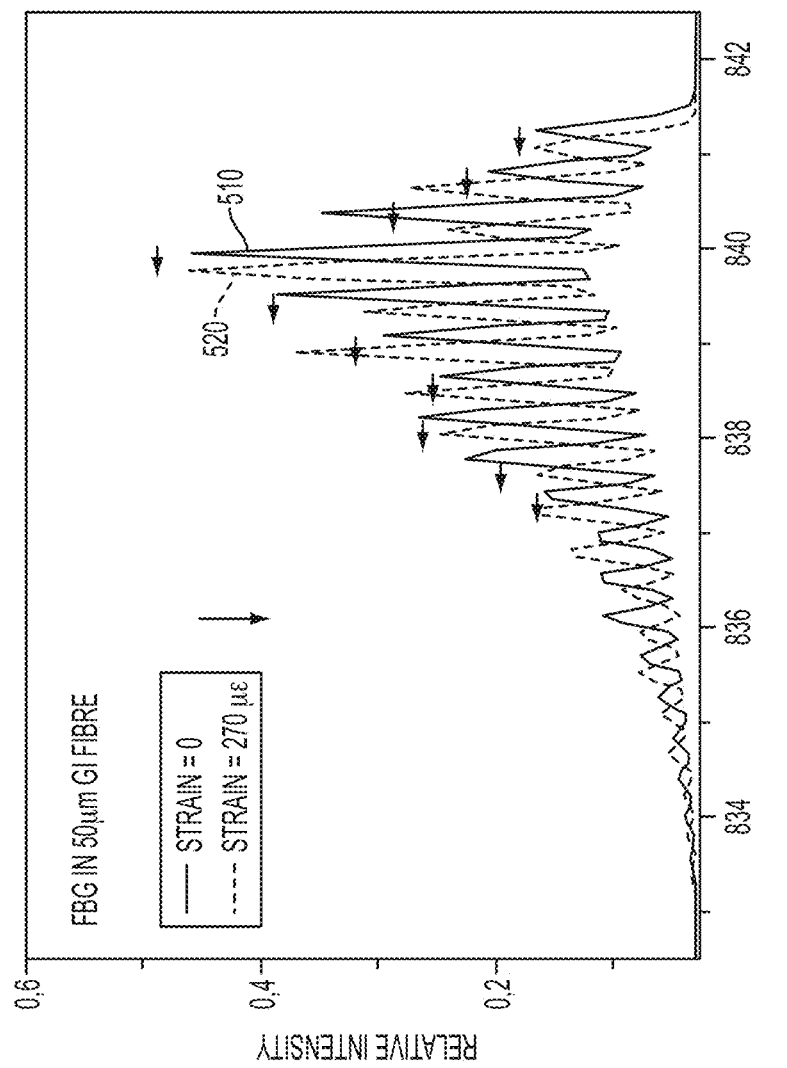
FIG. 5 shows the shift in the wavelength spectrum for a FBG sensor deployed on a multi-mode fiber optic cable.
Figure 6:
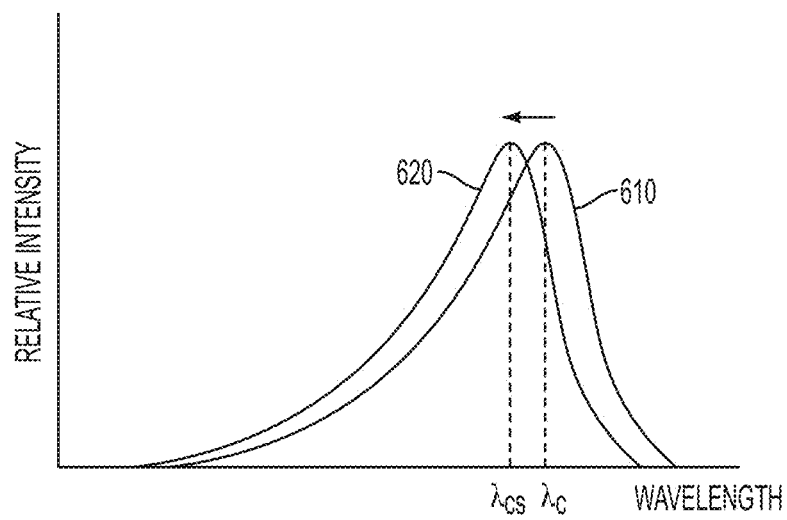
FIG. 6 shows the shift in the wavelength spectrum modulated envelope of the FBG sensor of FIG. 5.

FIG. 5 depicts actual data from an FBG sensor deployed on a MM FO cable. FBG sensors deployed on MM FO cables reflect light in multiple wavelength bands in contrast to FBG sensors on SM FO cable where only one wavelength band is reflected by the grating. In the characteristic base condition, the sensor reflects a characteristic spectrum that may include multiple narrower wavelength bands (also referred to as modes) as shown in graph 510. When a change in the sensed parameter occurs, the reflected wavelength spectrum 520 substantially maintains its shape, but is shifted in wavelength in response to the sensed condition. Analyzers discussed herein are particularly suited to interrogate MM FBG sensors because these analyzers detect the spectrum centroid (central value of the wavelength spectrum modulated envelope) rather than the shift of the individual modes. FIG. 6 shows the base wavelength spectrum modulated envelope 610 of the base wavelength spectrum 510 representing the reflected light when the FBG sensor is in the base condition. The envelope 610 may be characterized by a central or peak wavelength, $\lambda_c$, and a FWHM value. When exposed to the sensed condition, the reflected wavelength spectrum modulated envelope 620 of wavelength spectrum 520 shifts to a new central or peak wavelength, $\lambda_{cs}$. The envelope 620 may be characterized by a FWHM value and the central or peak wavelength, $\lambda_{cs}$. The FWHM value of the shifted 620 envelope may remain substantially unchanged from the base FWHM value, however the central or peak wavelength, $\lambda_{cs}$, is shifted from the base central wavelength, $\lambda_c$, by an amount related to the change in the sensed parameter.

Figure 7:
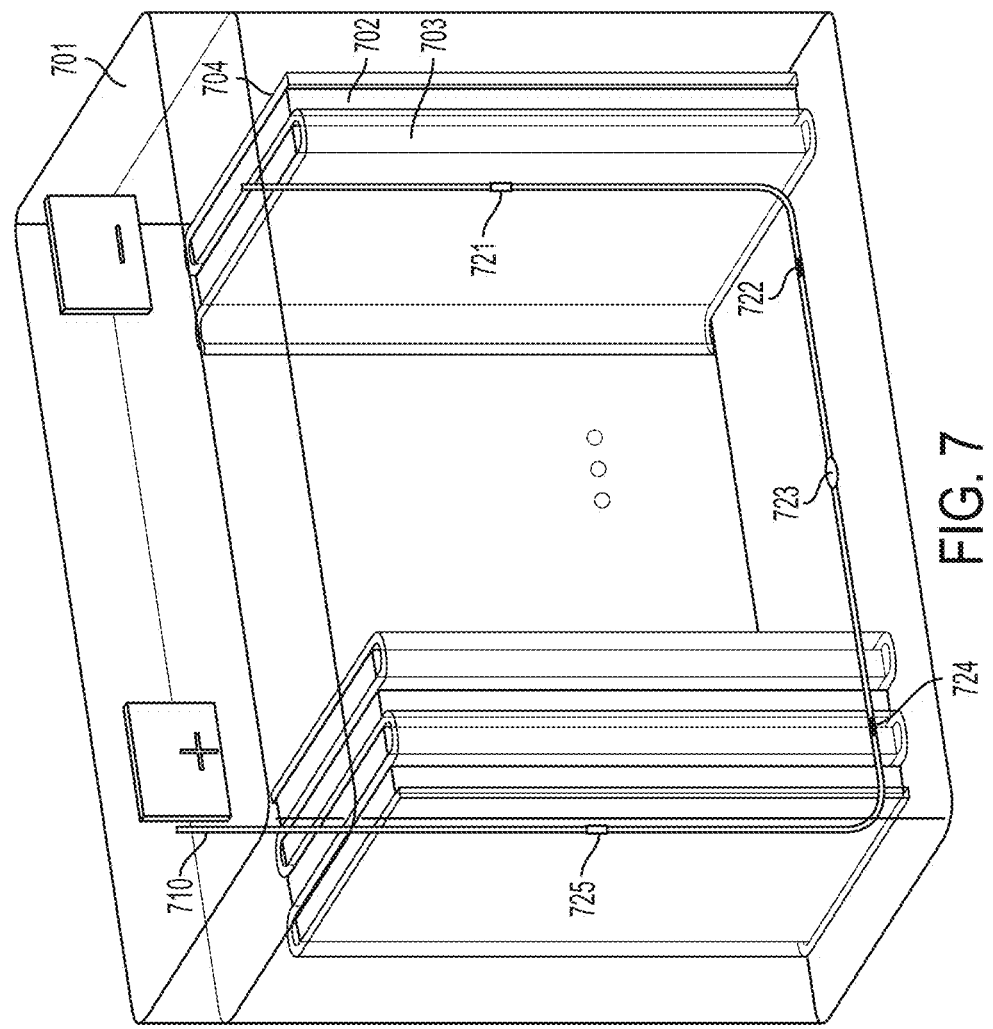
FIG. 7 shows a battery with multiple types of sensors arranged within a battery configured to sense multiple battery parameters.

FIG. 7 shows a portion of Li-ion battery 701 having a SM FO cable 710 with multiple optical sensors 721-725 deployed along the SM FO cable 710 so that the sensors 721-725 are arranged within the battery 701 at strategic locations. One or more sensors sense a battery parameter that is different from battery parameters sensed by one or more other FBG sensors. The battery 701 includes multiple cells, each cell having an anode electrode 702 and a cathode electrode 703 separated by a spacer layer 704.

The optical sensors include a first strain sensor 721 disposed on or embedded within a first electrode of the battery and a second strain sensor 725 disposed on or embedded within a second electrode of the battery. In this example, the first and second strain sensors 721, 725 are arranged on or within electrodes disposed at opposite sides the battery 701. The SM FO cable 710 also includes two temperature sensors 722, 724. In the embodiment of FIG. 7, a chemical sensor 723 is arranged between the temperature sensors 722, 724.

Figure 8:
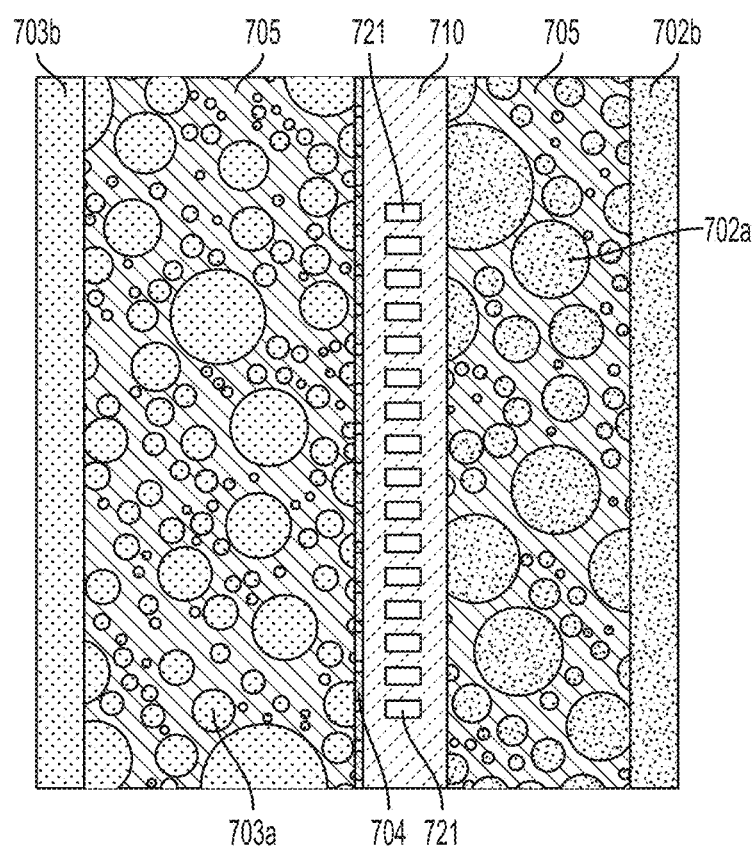
FIG. 8 is a detailed view of the battery of FIG. 7 that shows deployment of a sensor within an electrode of the battery.

FIG. 8 depicts a zoomed-in cross section of a portion of the battery 701 at the location of sensor 721. The cathode 703 comprises cathode material 703a disposed within an electrolyte matrix 705 and a cathode collector 703b. The anode comprises an anode material 702a disposed within the electrolyte matrix 705 and an anode collector 702b. The anode 702 and cathode 703 are separated by a separator layer 704. The portion of the SM FO cable 710 that includes sensor 721 is embedded within the anode 702, where optical sensor 721 may be used to measure strain and/or temperature of the anode 702.

FIGS. 7 and 8 show one representative embodiment that includes a commercial single-mode fiber optic (SM FO) cable with multiple FBG sensors operating in the 1.55 um wavelength range for temperature, strain, and chemical sensing inserted into a Li-ion battery. To allow distinguishing between strain and temperature, either special strain sensors or a combination of sensors is used. For example, special strain sensors can be used in conjunction with compensation processes implemented by the analyzer or the MMS. These compensation processes compensate strain according to temperature. In many cases, thermal response time is much slower than elastic response time. Temperature compensation/separation can be accomplished where the strain signal changes at a much higher frequency than temperature (e.g., in a turbine rotating at 50 Hz or a battery discharging quickly in an EV).

Alternatively, two sensors may be used as discussed above where a compensating optical sensor is arranged at a location that is detached from the electrode and thus is sensitive to temperature but is not subjected to the electrode strain. The signal from the compensating sensor is used to temperature-compensate the signal from the sensor that is used to measure electrode strain.

The two temperature sensors 722, 724 can operate at the same wavelength or both sensors 722, 724 may operate at wavelengths within an interrogation wavelength band. In either case, the sensors can be interrogated simultaneously to provide an average cell internal temperature. Simultaneous interrogation can occur when the light source emits interrogation light that includes a wavelength band that both sensors reflect. The sensor nearest the light source reflects a first portion of light in the wavelength band and the second sensor reflects a second portion of the light in the wavelength band. Note that if multiple FBG sensors have the same or overlapping wavelength ranges, the reflectivity of the sensors may be relatively low. Otherwise, the reflected signal from the sensor that is farthest from the light source will be reflected by the sensor that is closer to the light source. The first of multiple sensors at a particular wavelength may not be substantially affected, but every subsequent sensor at that wavelength may have reduced sensitivity, depending on the transmitted/reflected signal strengths. Two sensors having non-overlapping wavelength ranges within the interrogation wavelength range are not so constrained with regard to their reflectivity and can still be interrogated simultaneously if the interrogation wavelength range overlaps the wavelength sensitivity ranges of both sensors.

The two strain sensors 721, 725 may also operate in the same wavelength range, or within the interrogation wavelength range that is distinct from the one used for temperature sensors 722, 724. In the embodiment shown in FIG. 7, the strain sensors 721, 725 are embedded within the outermost electrodes on opposite sides of the battery 701 to obtain averaged electrode strain (after compensating for the effect of temperature) for the battery.

The chemical sensor 723 may be either a functionalized strain sensor, such as a strain sensor having a coating that is reversibly sensitive to the concentration of a particular chemical/ion solution around it and swells or contracts with increasing/decreasing chemical concentration, thereby reflecting a signal indicative of chemical/ion concentration. Alternatively, a side-polished FBG sensor can be used to sense battery chemistry, where the side polishing exposes the FBG so that changes in the signal reflected by the sensor are caused by exposure to the chemical environment of the battery. The chemical sensor 723 can be used to provide information regarding adverse chemical changes in the electrolyte from aging-related degradation. The five sensors 721-725 may be illuminated with a broadband light source, e.g., one or multiple superluminescence LED or LD, and the reflection peaks produced by the sensors 721-725 will be spectrally separated and uniquely associated with each type of FBG sensor 721-725. The spectral shifts in the reflection peaks will be discerned by an analyzer as discussed in more detail herein. This interrogation technique can be combined with time division multiplexing (switching on the different light sources at different times in order to interrogate a certain subgroup of sensors, as described above.

A more economical configuration for commercial applications would use MM FO cables instead of the SM FO cable indicated in FIGS. 7 and 8. MM FO cables have a larger core diameter (typically >50 μm) than SM FOs and, therefore, enable a simplified system assembly. In addition, MM FOs are capable of using standard LEDs as broadband light sources, which are much less expensive than superluminescence LEDs. The analyzers discussed herein are particularly suited for MM FOs with optical sensors disposed thereon because these analyzers are capable of determining the average wavelength shift of all modes rather than the wavelength shift of individual modes. Furthermore, the analyzers discussed herein are largely insensitive to the FWHM of the incoming light.

Typical wavelength shifts for FBG temperature sensors are about 10 pm/K so that a representative dynamic range of 100° C. corresponds to a total wavelength change of 1 nm. With an expected wavelength detection accuracy of 10 pm in MM fibers (with 30 fm demonstrated in SM fibers) a temperature accuracy of 1° C. is achievable. With regard to strain measurements, for reported volume changes of 10% in Li-cell electrodes, total length changes in each direction of the electrode of approximately 3.2% are estimated. Thus, FBG strain sensors are well suited for measuring relative length changes of 100 με, even with MM fibers. This implies an accuracy of 1/320th or better of the minimum 3.2% peak strain typical in Li-ion electrodes. For sensing adverse chemical composition changes (HF formation in the case of Li-ion cells), 50 ppm HF detectability may be achieved. Detection of HF ingress at this level will suffice for early HF detection indicative of problematic seals or other moisture ingress issues that can rapidly age the cell electrodes.

Figure 9:
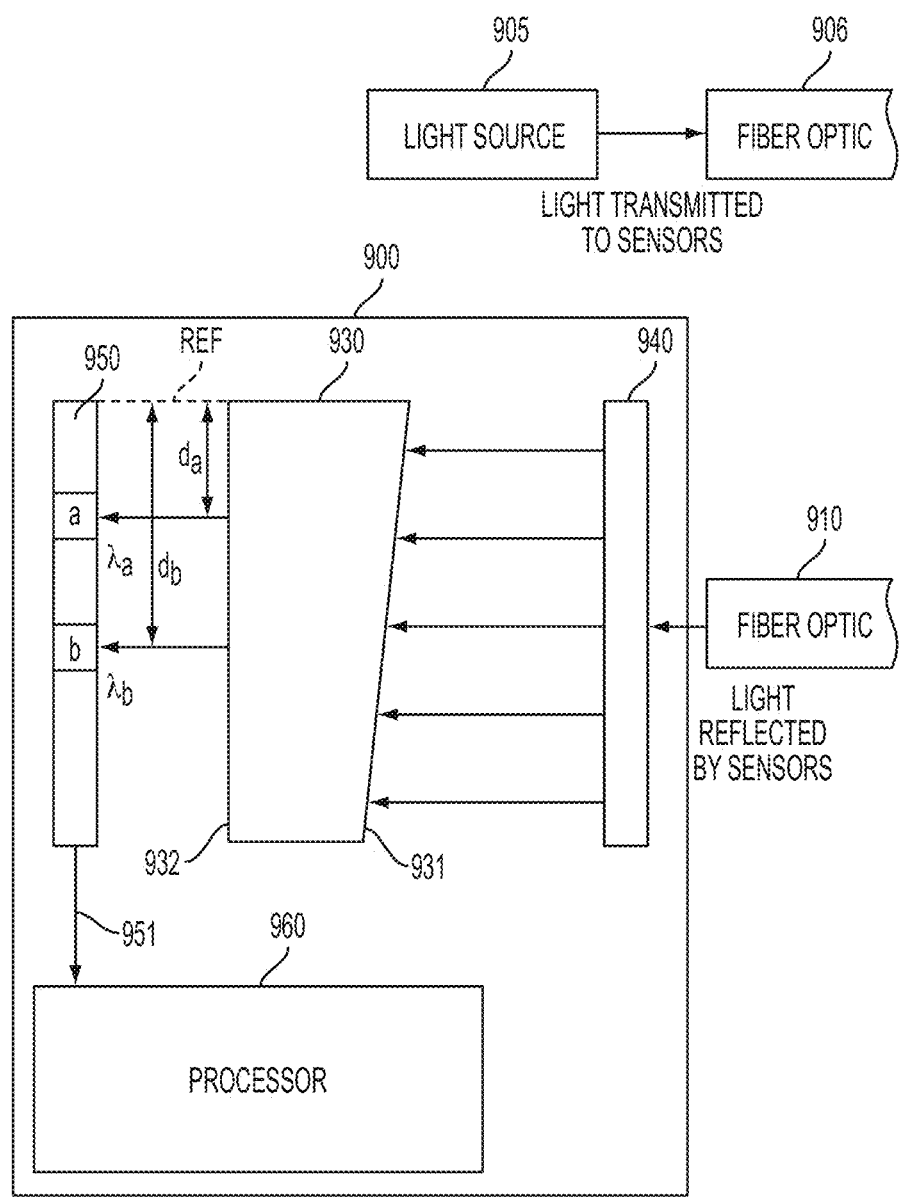
FIG. 9 is a block diagram showing portions of an analyzer used to detect changes in sensed parameters for power supply monitoring.

FIG. 9 is a block diagram illustrating portions of a light source and analyzer 900 that may be used to detect and/or interpret optical signals received from an MM or SM FO cable having multiple optical sensors arranged at locations in, on or about an energy storage/power system. The light source 905 transmits input light to the sensors via FO 906. The analyzer 900 includes various components that may optionally be used to analyze the light reflected by the sensors and propagated by FO 910. The analyzer 900 includes an optional spreading component 940 configured to collimate and/or spread the light from the FO cable 910 across an input surface of a linearly varying transmission structure (LVTS) 930. In arrangements where sufficient spreading of the light occurs from the FO, the spreading component may not be used. The LVTS 930 may comprise a dispersive element, such as a prism, or linear variable filter. The LVTS 930 receives light at its input surface 931 (from the FO 910 and (optionally) the spreading component 940) and transmits light from its output surface 932. At the output surface 932 of the LVTS 930, the wavelength of the light varies with distance along the output surface 932. Thus, the LVTS 930 can serve to demultiplex the optical signal incident at the input surface 931 of the LVTS 930 according to the wavelength of the light. FIG. 9 shows two wavelength bands (called emission band) emitted from the LVTS 930, a first emission band has a central wavelength of $\lambda_a$ emitted at distance $d_a$ from a reference position (REF) along the output surface 932. The second emission band has a central wavelength $\lambda_b$ and is emitted at distance $d_b$ from the reference position. A position sensitive detector (PSD) 950 is positioned relative to the LVTS 930 so that light transmitted through the LVTS 930 falls on the PSD. For example, light having wavelength $\lambda_a$ falls on region a of the PSD 950 and light having wavelength $\lambda_b$ falls on region b of the PSD 950. The PSD generates an electrical signal along output 951 that includes information about the position (and thus the wavelength) of the light output from the LVTS. The output signal from the PSD is used by the processor 960 to detect shifts in the wavelengths reflected by the sensors.

The PSD may be or comprise a non-pixelated detector, such as a large area photodiode, or a pixelated detector, such as a photodiode array or charge coupled detector (CCD). Pixelated one-dimensional detectors include a line of photosensitive elements whereas a two-dimensional pixelated detector includes an n x k array of photosensitive elements. Where a pixelated detector is used, each photosensitive element, corresponding to a pixel, can generate an electrical output signal that indicates an amount of light incident on the element. The processor 960 may be configured to scan through the output signals to determine the location and location changes of the transmitted light spot. Knowing the properties of the LVTS allows determining peak wavelength(s) and shift of the peak wavelength(s) of the first and/or second emission band. The wavelength shift of the first or second emission band can be detected as a shift of the transmitted light spot at location a or b. This can, for example, be accomplished by determining the normalized differential current signal of certain pixels or pixel groups of the PSD.

For example, consider the example where light spot A having emission band $EB_A$ is incident on the PSD at location a. $I_{a1}$ is the current generated in the PSD by light spot A by pixel/pixel group at location a1 and $I_{a2}$ is the current generated in the PSD by light spot A by pixel/pixel group at location a2. Light spot B having emission band $EB_B$ is incident on the PSD at location b. $I_{b1}$ is the current generated in the PSD by light spot B by pixel/pixel group at location b1 and $I_{b2}$ is the current generated in the PSD by light spot B by pixel/pixel group at location b2.

The normalized differential current signal generated by pixels or pixel groups at locations a1 and a2 can be written $(I_{a1}-I_{a2})/(I_{a1}+I_{a2})$, which indicates the position of light spot A on the PSD. The wavelength of $EB_A$ can be determined from the position of light spot A on the PSD.

Similarly, the normalized differential current signal generated by pixels or pixel groups at locations b1 and b2 can be written $(I_{b1}-I_{b2})/(I_{b1}+I_{b2})$, which indicates the position of light spot B on the PSD. The wavelength of $EB_B$ can be determined from the position of light spot B on the PSD.

Figure 10:
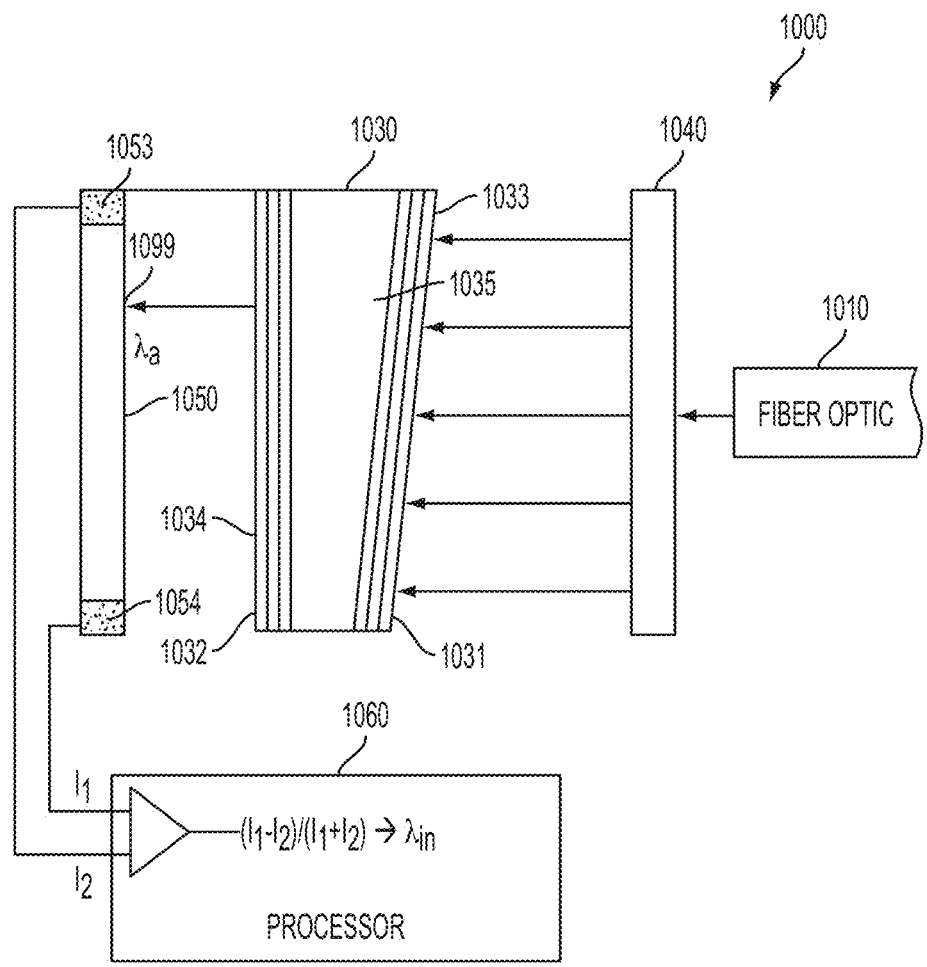
FIG. 10 is a block diagram showing portions of an analyzer that uses a non-pixelated photosensitive detector.

FIG. 10 is a block diagram illustrating portions of an analyzer 1000 that includes a non-pixelated, one-dimensional PSD 1050. The analyzer 1000 includes an optional spreading component 1040 that is similar to spreading component 940 as previously discussed. The spreading component 1040 is configured to collimate and/or spread the light from the FO cable 1010 across an input surface 1031 of a linearly varying transmission structure (LVTS) 1030. In the implementation depicted in FIG. 10, the LVTS 1030 comprises a linear variable filter (LVF) that comprising layers deposited on the PSD 1050 to form an integrated structure. The LVF 1030 in the illustrated example comprises two mirrors, e.g., distributed Bragg reflectors (DBRs) 1033, 1034 that are spaced apart from one another to form optical cavity 1035. The DBRs 1033, 1034 may be formed, for example, using alternating layers of high refractive index contrast dielectric materials, such as $SiO_2$ and $TiO_2$. One of the DBRs 1033 is tilted with respect to the other DBR 1034 forming an inhomogeneous optical cavity 1035. It will be appreciated that the LVF may alternatively use a homogeneous optical cavity when the light is incident on the input surface at an angle.

The PSD 1050 shown in FIG. 10 is representative of a non-pixelated, one-dimensional PSD although two-dimensional, non-pixelated PSDs (and one or two-dimensional pixelated PSDs) are also possible. The PSD 1050 may comprise, for example, a large area photodiode comprising a semiconductor such as InGaAs. Two contacts 1053, 1054 are arranged to run along first and second edges of the semiconductor of the PSD to collect current generated by light incident on the surface of the PSD 1050. When a light spot 1099 is incident on the PSD 1050, the contact nearest the light spot collects more current and the contact farther from the light spot collects a lesser amount of current. The current from the first contact 1053 is denoted $I_1$ and the current from the second contact 1054 is denoted $I_2$. The processor 1060 is configured to determine the normalized differential current, $(I_1+I_2)/(I_1+I_2)$, the position of the transmitted light spot, and therefore the predominant wavelength of the light incident at the input surface 1031 of the LVTS 1030 can be determined. The predominant wavelength may be compared to known wavelengths to determine an amount of shift in the wavelength. The shift in the wavelength can be correlated to a change in the sensed parameter. In case two emission bands (creating two spatially separated light spots) hitting the detector at the same time the detector is only capable to provide an average wavelength and wavelength shifts for both emission bands. If wavelength and wavelengths shift of both emission bands need to be determined separately the two emission bands need to hit the detector at different time (time multiplexing).

Figure 11:
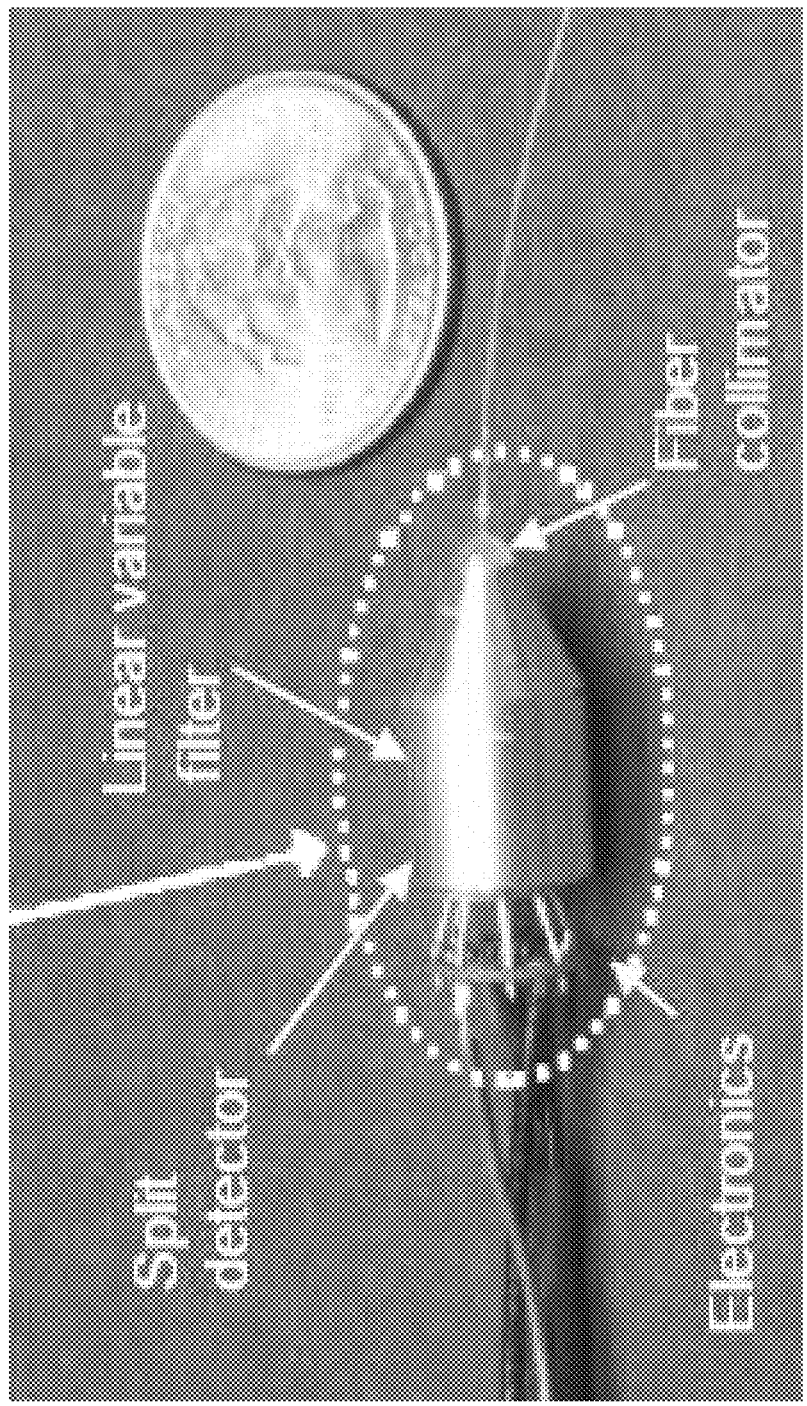
FIG. 11 is a photograph of a packaged analyzer.

In other embodiments, a two dimensional non-pixelated PSDs may be used, with edge contacts running along all four edges. The position of the central reflected wavelength may be determined by analyzing the current collected from each of the four contacts. The portion of the analyzer shown in FIG. 10 may be packaged together in a suitable housing, e.g., TO5 transistor header, as shown in FIG. 11.

Figure 12:
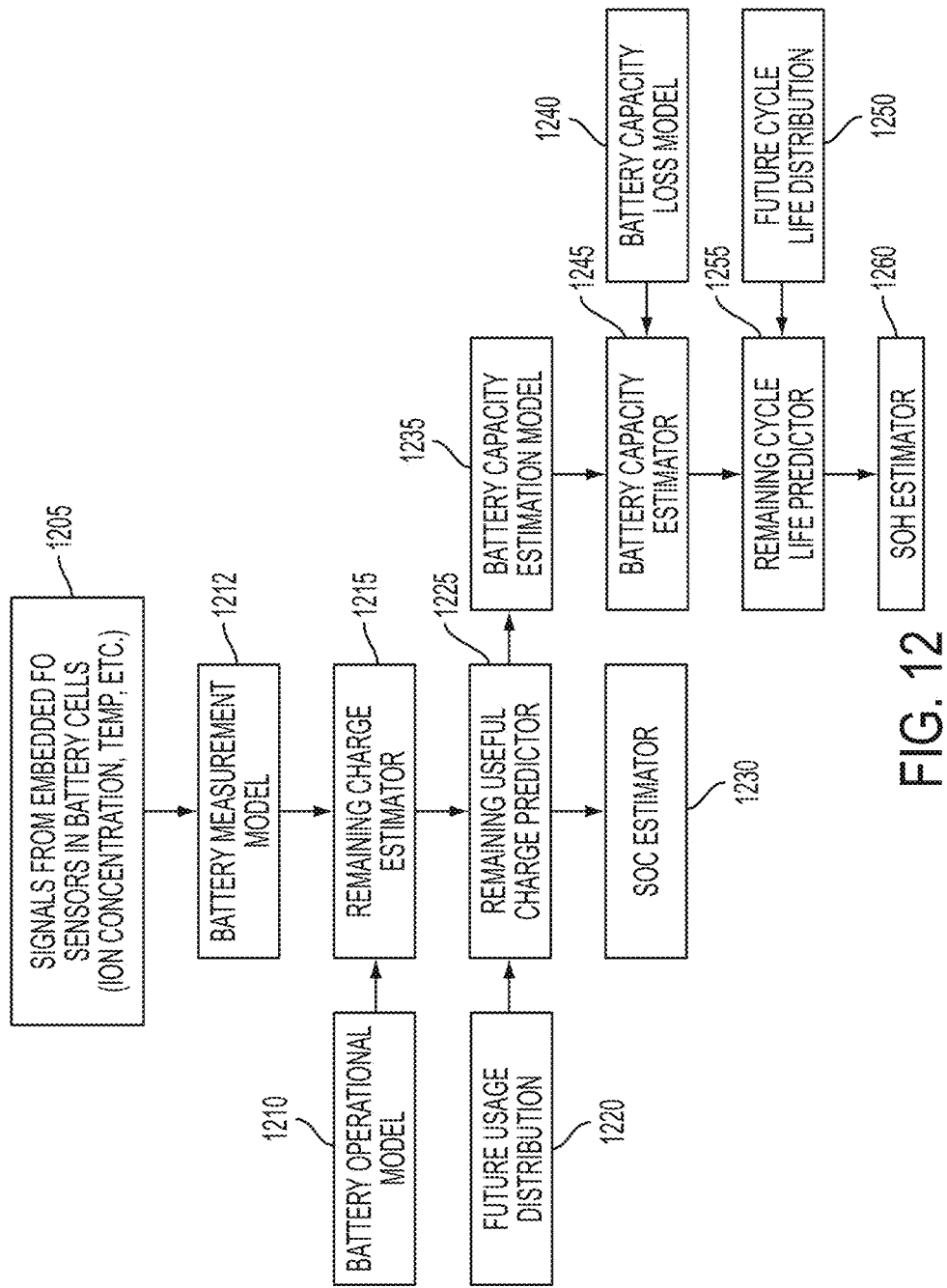
FIG. 12 is a flow diagram that illustrates a management process that can be used for an energy storage device.

Sensed parameter information can be combined with modeling of the power system, e.g., battery, to estimate operating variables of the battery such as state-of-charge and/or state-of-health. FIG. 12 is a flow diagram that illustrates processes to determine SOC and SOH. Estimating SOH and/or SOC may be performed in a variety of ways. One embodiment could be to develop models for the battery operation and the measurement scheme, either through physical modeling from first principles or from data-driven machine learning from characterization experiments. The battery operational model 1210 encapsulates how the battery state variables like charge, ion-concentration, voltage, temperature, or a subset thereof changes based on load and environmental factors like current, ambient temperature and pressure, or some subset of these. The battery measurement model 1212 expresses the relation between the sensed parameters 1205 from the FO sensors in the battery cells and the battery state variables, and includes the behavioral dynamics of the sensor. Information from these two models as well as the sensed values can be combined by state tracking, filtering or estimation techniques to estimate the remaining charge in the battery 1215. Crude estimates of SOC may be derived by dividing this charge by the expected total capacity of the battery. However, the not all the remaining charge may be usable since it depends on the load and environmental factors as well as the cutoff thresholds of the associated BMMS. Hence, a stochastic distribution of the intended future usage can be used to derive the remaining useful charge 1225 and then this value can be used to estimate 1230 the SOC or the "usable" SOC.

A similar process can be followed for the SOH calculations, where the battery capacity estimation model 1235 that computes the present battery capacity as the sum of the measured charge used (Coulomb counting) and the remaining usable charge, and the battery capacity loss model 1240 that indicates how the capacity changes from one cycle (a full discharge-charge event is called a cycle) to another based on cycle-life, usage conditions and storage environment, can be combined to better estimate 1245 the present battery capacity. Note that each model individually can be used to the get the capacity from the current cycle measurements or the previous cycle measurements, respectively. However, due to sensor errors, model uncertainties and the fact that most real usage cycles are partial cycles, the combined capacity estimate is better than the individual ones. Subsequently, a stochastic distribution 1250 of the future cycle life can be used to predict 1255 the number of cycles left until the capacity falls below an end-of-life threshold. The SOH can then be computed 1260 as the fraction of present capacity over rated capacity or the remaining cycles over the expected total number of cycles. The SOH can also be derived from internal parameters like the battery impedance and mapping it to capacity or cycle life using machine learning techniques applied over experimental or operational data.

Other embodiments may skip parts of the modeling steps and may derive direct relations between the sensed values and the battery states (SOC and SOH) by using techniques like neural networks or other machine learning algorithms.

Embodiments disclosed herein involve multiplexed optical sensors on a single optical fiber embedded within various components of an energy storage/power system such as within individual cells of a battery. When used in battery applications, the monitoring and management systems described herein are capable of measuring electrode strain, ion concentrations, internal temperature, internal pressure, and/or adverse chemical compositions, each of which are internal cell-state variables of the battery. According to one embodiment, 25 sensors are multiplexed with acquisition frequency of about 100 Hz. The strain measurement accuracy is about 10 $\mu\epsilon$ for the multiplexed SM FO version or 100 $\mu\epsilon$ for the multiplexed MM FO version. Strain measurement accuracy of 100 $\mu\epsilon$ is sufficient to measure electrode strains for Li-ion cells (which have peak strain amplitudes of 32000 $\mu\epsilon$ or higher) and cell pressure with sufficient accuracy for SOC/SOH determination. A temperature measurement accuracy of about 0.5° C. for the multiplexed SM FO version and 1° C. for the multiplexed MM FO version can be achieved. Temperature measurement accuracy of 1° C. is sufficient for early detection of thermal runaways and also to account for model compensation to determine SOC. In some embodiments, the monitoring and management system is capable of detecting adverse chemical composition. For example, both the multiplexed SM FO version and multiplexed MM FO version of the system are capable of detecting 50 ppm HF concentration.

As previously discussed, since such optical sensors can survive harsh environments and loads over expected lifetimes of such systems and are inherently immune to EMI, they are not expected to suffer from reduced sensitivity in field applications due to interference from the many other high-duty electronic components in practical applications such as electric vehicles (EVs).

Due to the small form factor and light weight of optical fibers (100-500 $\mu$m dia. and density of 1-1.5 g/cc) and the compactness of the analyzer, volume and weight overheads of the monitoring and management system are expected to be minimal (<0.05% volume overhead within the cell, <0.1% volume overhead overall; and <0.05% weight within the cell, <0.1% weight overall).

Due to the minimal volume overhead of thin fiber optic cables, the energy density will also have minimal impact (<0.05% energy density overhead), which is well compensated by the benefits of accurate internal cell-state measurement, which include reductions in conservative oversizing. Since the signals are entirely optical, there will be no interference with the internal voltage field of the cell (unlike reference electrodes). As summarized earlier, the FO material is benign and robust to various harsh environments, including Pb-acid batteries and HF. By careful choice of the FO ingress point (e.g., at an electrode), the thin FO cable is not expected to affect cell sealing.

The specifications for the monitoring and management systems detailed above allow real-time (at 100 Hz) detection of a broad variety of cell faults ranging from design flaws, manufacturing defects, and aggressive operation, each of which would result in abrupt changes or anomalies in internal cell parameters of magnitude well over these resolution limit targets. Thus, it is feasible to approach 100% diagnostic sensitivity. The immunity to EMI and ability to function in harsh environments without degraded performance implies that false alarms from such systems will be minimal, thereby making it realistic to achieve >95% diagnostic specificity.

The capability to accurately detect cell faults with high sensitivity and specificity implies that the control strategy can reliably uncouple or reduce the demands on weaker/defective cells early, thereby allowing the pack to function safely through adaptive management and preventing catastrophic failure events such as thermal runaways.

Due to uncertainties in estimates of internal cell-state variables, most commercial Li-ion battery systems today are conservatively designed and thus only allow access to 10-80% of their stored energy capacity. Embodiments disclosed herein enable internal cell state measurement in terms across a number of variables and prognostic algorithms that enable high-accuracy (2.5%) predictions of remaining life, allowing reductions in conservative over-design. In addition, using algorithms that are based on accurate internal cell state measurements, it is feasible to get more accurate state-of-health estimates and extend cell life, resulting in even greater reductions in over-sizing design practices.

Accurate internal cell-state measurements can allow informed decisions about whether faster charging cycles are adversely impacting a particular cell in a pack. This can allow for optimized charging cycles, which account for cell-to-cell manufacturing/state of health variation.

Systems, devices, or methods disclosed herein may include one or more of the features, structures, methods, or combinations thereof described herein. For example, a device or method may be implemented to include one or more of the features and/or processes described herein. It is intended that such device or method need not include all of the features and/or processes described herein, but may be implemented to include selected features and/or processes that provide useful structures and/or functionality.

In the above detailed description, numeric values and ranges are provided for various aspects of the implementations described. These values and ranges are to be treated as examples only, and are not intended to limit the scope of the claims. For example, embodiments described in this disclosure can be practiced throughout the disclosed numerical ranges. In addition, a number of materials are identified as suitable for various implementations. These materials are to be treated as exemplary, and are not intended to limit the scope of the claims.

The foregoing description of various embodiments has been presented for the purposes of illustration and description and not limitation. The embodiments disclosed are not intended to be exhaustive or to limit the possible implementations to the embodiments disclosed. Many modifications and variations are possible in light of the above teaching.

The invention claimed is:

1. A system, comprising:
one or more multi-mode fiber optic cables arranged within or on portions of an energy storage device, each fiber optic cable including multiple optical sensors, at least one of the optical sensors configured to sense a parameter of the energy storage device that is different from a parameter of the energy storage device sensed by at least another optical sensor of the multiple optical sensors;
a light source configured to provide light to the one or more fiber optic cables;
a detector configured to detect light reflected by the optical sensors and to generate an electrical signal based on the reflected light; and
a processor coupled to receive the electrical signal, to analyze the electrical signal and to determine state of the energy storage device based on analysis of the electrical signal.

2. The system of claim 1, wherein each of the multiple optical sensors comprises one or more of a sensor configured to sense mechanical strain of a component of the energy storage device, a sensor configured to sense cell wall pressure of the energy storage device, and a sensor configured to sense chemistry inside the energy storage device.

3. The system of claim 1, wherein the multiple optical sensors comprise at least one sensor configured to sense temperature, at least one sensor configured to sense mechanical strain of an energy storage device component, and at least one sensor configured to sense chemistry inside the energy storage device.

4. The system of claim 1, wherein at least one of the multiple sensors is a reference sensor used to compensate a parameter of the energy storage device sensed by another sensor.

5. The system of claim 1 wherein one of the multiple sensors comprises a strain sensor configured to measure strain of a component of the energy storage device and another sensor of the multiple sensors comprises a temperature sensor configured to measure temperature of the component, wherein an output of the temperature sensor is used to temperature-compensate an output of the strain sensor.

6. The system of claim 1, wherein one or more of the optical sensors comprise fiber Bragg grating sensors.

7. The system of claim 1, wherein one or more of the optical sensors comprise Fabry-Perot sensors.

8. The system of claim 1, further comprising an optical element coupled between the fiber optic cable and the detector, the optical element configured to demultiplex optical signals from the multiple sensors.

9. The system of claim 8, wherein the optical element comprises a linear variable filter.

10. The system of claim 1, wherein:
the light source is configured to emit pulses of light separated in time, including a least a first narrow wavelength band light pulse having a first peak wavelength emitted at a first time and a second narrow wavelength band light pulse having a second peak wavelength emitted at a second time;
a first sensor of the multiple sensors is substantially responsive to the first peak wavelength and is substantially unresponsive to the second peak wavelength; and
the second sensor is substantially responsive to the second peak wavelength and is substantially unresponsive to the first peak wavelength.

11. The system of claim 1, wherein the multiple sensors include two first sensors configured to sense a first energy storage device parameter and a second sensor configured to sense a second energy storage device parameter wherein and the two first sensors are substantially responsive to a first peak wavelength and are substantially unresponsive to a second peak wavelength and the second sensor is substantially responsive to the second peak wavelength and is substantially unresponsive to the first peak wavelength.

12. The system of claim 1, wherein the light source is a broad wavelength band light source.

13. The system of claim 1, wherein the energy storage device comprises a battery disposed within an electric vehicle.

14. A system, comprising:
one or more fiber optic cables arranged within or on portions of an energy storage device, each fiber optic cable including multiple optical sensors, at least one of the optical sensors configured to sense a parameter of the energy storage device that is different from a parameter of the energy storage device sensed by at least another optical sensor of the multiple optical sensors;
a light source configured to provide light to the one or more fiber optic cables;
a detector configured to detect light reflected by the optical sensors and to generate an electrical signal based on the reflected light; and
a processor coupled to receive the electrical signal, to analyze the electrical signal and to determine state of the energy storage device based on analysis of the electrical signal.

15. A method, comprising:
transmitting light into one or more fiber optic cables, the fiber optic cables arranged within or on components of an energy storage device, each fiber optic cable including multiple optical sensors, at least one of the optical sensors configured to sense an internal parameter of the energy storage device that is different from a parameter sensed by at least one other optical sensor of the multiple optical sensors;

detecting light reflected by one or more of the multiple optical sensors and generating an electrical signal in response to detecting the reflected light;

analyzing the electrical signal; and determining state of the energy storage device based on analysis of the electrical signal.

16. The method of claim 15, further comprising:

demultiplexing the reflected light; and detecting the demultiplexed light.

17. The method of claim 15, wherein analyzing the electrical signal comprises detecting shifts between a spectrum of light transmitted into the one or more fiber optic cables and a spectrum of the reflected light.

18. The method of claim 17, wherein:

at least one of the fiber optic cables comprises a multi-mode fiber optic cable; and the spectrum of the reflected light is a multi-modal spectrum.

19. The method of claim 15, wherein:

transmitting the light comprising transmitting light having a first peak wavelength; and determining the state of the battery comprises determining an average value for the first battery parameter based on a portion of the light having the first peak wavelength that is reflected by two or more of the sensors.

20. The method of claim 15, further comprising sensing external parameters of the energy storage device including one or more of battery voltage and current.

* * * * *